(12) United States Patent
Hayashi et al.

(10) Patent No.: US 9,891,352 B2
(45) Date of Patent: Feb. 13, 2018

(54) ANTI-GLARE FILM AND PROCESS FOR PRODUCING THE SAME

(71) Applicant: DAICEL CORPORATION, Osaka-shi, Osaka (JP)

(72) Inventors: Masaki Hayashi, Amagasaki (JP); Masashi Yokoyama, Amagasaki (JP); Hiroshi Takahashi, Amagasaki (JP)

(73) Assignee: DAICEL CORPORATION, Osaka-shi, (JP)

( * ) Notice: Subject to any disclaimer, the term of this patent is extended or adjusted under 35 U.S.C. 154(b) by 131 days.

(21) Appl. No.: 14/254,944

(22) Filed: Apr. 17, 2014

(65) Prior Publication Data

US 2015/0301237 A1 Oct. 22, 2015

(51) Int. Cl.
*G02B 5/02* (2006.01)
*H01L 51/52* (2006.01)

(52) U.S. Cl.
CPC ......... *G02B 5/0221* (2013.01); *G02B 5/0268* (2013.01); *H01L 51/5281* (2013.01)

(58) Field of Classification Search
CPC .. G02B 5/0221; G02B 5/0226; G02B 5/0268; G02B 5/0273; G02B 5/0278; G02B 5/021; G02B 5/0294; H01L 51/5281
See application file for complete search history.

(56) References Cited

U.S. PATENT DOCUMENTS

| 2002/0154260 | A1* | 10/2002 | Uchida | G02B 5/0236 349/112 |
| 2008/0057228 | A1* | 3/2008 | Horie | G02B 5/0215 428/1.32 |
| 2011/0003093 | A1* | 1/2011 | Hayashi | C08F 265/04 428/1.33 |
| 2012/0013987 | A1* | 1/2012 | Oki | G02B 5/0221 359/599 |

FOREIGN PATENT DOCUMENTS

| JP | 2001-215307 A | 8/2001 |
| JP | 2004-126495 A | 4/2004 |
| JP | 2008-225195 A | 9/2008 |
| JP | 2009-244382 A | 10/2009 |
| JP | 4377578 B2 | 12/2009 |
| JP | 2010-66470 A | 3/2010 |
| JP | 2011-13238 A | 1/2011 |
| JP | 2011-253106 A | 12/2011 |

OTHER PUBLICATIONS

Office Action issued in Japanese Patent Application No. 2012-231496 dated Jun. 28, 2016 (with English Translation).

* cited by examiner

*Primary Examiner* — Marin Pichler
(74) *Attorney, Agent, or Firm* — Birch, Stewart, Kolasch & Birch, LLP

(57) ABSTRACT

An anti-glare film comprises an anti-glare layer having a ridge on a surface thereof. The ridge is formed by phase separation of a plurality of resin components, and the ridge has a branched structure and a total length of not less than 100 μm, and one or more of the ridges per square millimeter exist on the surface of the anti-glare layer.

11 Claims, 2 Drawing Sheets

ANTI-GLARE FILM AND PROCESS FOR PRODUCING THE SAME

FIELD OF THE INVENTION

The present invention relates to an anti-glare film suitable for preventing sparkling of a transmitted image (or picture) and reflection of an exterior light source in display surfaces of various displays (display apparatuses or devices), and a process for producing the anti-glare film.

BACKGROUND OF THE INVENTION

To prevent reflection of a surrounding scenery in a display surface of a liquid crystal display, an organic electroluminescent (EL) display, or others, the display surface is usually kept away from regular reflection by coating or applying a mixture of a fine particle and a binder resin or curable resin on a support to form a finely (or minutely) uneven structure (minute recesses and projections) on the surface, and has anti-glareness. For a high definition display having a fine pixel size, unfortunately, a conventionally used surface-uneven size brings about debasement of an image, such as sparkling of transmitted images (or pictures) or blur of characters. Specifically, for the high definition display apparatus, the degree of the conventionally used surface-uneven size is close to that of the pixel size in the high definition display, and sparkling is generated due to a lens effect caused by the surface unevenness. Moreover, since the centroid position of the fine particles is unable to control in the inside and surface structures of a coat layer, the transmitted scattered-light distribution shows the Gaussian distribution with a central focus on a rectilinear transmitted light. In a conventional fine particle size, accordingly, the scatteration on the periphery of the rectilinear transmitted light increases; this makes the pixel border vague or unclear and thus induces blur (or clouding) of characters. Further, the intensity distribution of the transmitted scattered-light depends on the size of a fine particle added; a smaller fine particle decreases scattering on the periphery of the rectilinear transmitted light and reduces sparkling, and a larger fine particle increases scattering on the periphery of the rectilinear transmitted light and causes sparkling.

In order to solve these problems, the control of the uneven surface structure (or the surface structure having recesses and projections) is being attempted by reducing the size of a fine particle to be added or by using a fine particle having a narrow and sharp particle size distribution. In these manners, however, the control of the centroid position of the fine particles is necessary for preventing sparkling or blurred characters. Moreover, a smaller uneven surface structure makes it difficult to attain both adequate anti-glareness and prevention of sparkling or blurred characters, and such a manner is unfavorable in view of cost performance.

Japanese Patent Application Laid-Open Publication No. 2001-215307 (JP-2001-215307A; see Claims) discloses an anti-glare layer containing a transparent fine particle having an average particle size of not larger than 15 μm in a coat layer whose thickness is not less than twice of the average particle size, wherein the anti-glare layer has a surface having a finely uneven structure through uneven distribution of the transparent fine particles in one side being in contact with air of the coat layer. This document also discloses an optical member comprising a polarizing plate or an elliptically polarizing plate, at least one side of the polarizing plate or the elliptically polarizing plate having the anti-glare layer.

Unfortunately, for this anti-glare layer, since the intensity distribution of the transmitted scattered-light is controlled by changing the particle size, sparkling or blurred characters (blur of characters) on a display surface cannot be prevented effectively.

Japanese Patent Application Laid-Open Publication No. 2011-13238 (JP-2011-13238A; see Claims, paragraphs [0012] and [0035]) discloses, as an anti-glare film having an uneven surface structure that provides anti-glareness and high contrast, an anti-glare film comprising a translucent support and an anti-glare layer laminated thereon, wherein the anti-glare layer has a bicontinuous structure having a net-like (or network-like) pattern with a size of each net-like pattern (or cell) of 10 to 150 μm in a horizontal direction and at least contains a first phase and a second phase. According to this document, the bicontinuous structure is formed by aggregating an inorganic component in the anti-glare layer in film formation. The document defines the term "bicontinuous structure" as a structure having a peak (projection or protruded portion) with a smaller and gentler slope (inclination) in an uneven surface structure compared with a surface structure of a conventional anti-glare layer.

The bicontinuous structure described in the document is formed by convection with aggregation of the inorganic component. Unfortunately, since it is difficult to regulate the convection precisely, the resulting bicontinuous structure lacks uniform size of each net-like pattern and uniform thickness (width) of each net (or cell wall). Thus a finely uneven structure by which sparkling is reduced and a coarsely uneven structure by which sparkling is increased coexist in the anti-glare layer; it is essentially impossible to achieve both sparkling reduction and anti-glareness. Further, an uneven structure having a small size of each net-like pattern can reduce sparkling, while the anti-glare layer fails to show sufficient anti-glareness. In contrast, an uneven structure having a large size of each net-like pattern cannot reduce sparkling because the degree of the surface-uneven size is close to that of the pixel size.

Meanwhile, it is also known that an uneven structure is formed on a surface by spinodal decomposition of resin components incompatible with each other. Japanese Patent No. 4377578 (JP-4377578B; see claim 1, paragraphs [0058], [0059], [0071] and [0083], and Examples) discloses an anti-glare film comprising an anti-glare layer, wherein the anti-glare layer has an uneven surface structure, isotropically transmits and scatters an incident light, contains at least one polymer and at least one curable resin-precursor, and has a phase-separation structure. This document discloses that, for a process of producing a sheet by evaporating a solvent from a uniform solution containing at least one polymer and at least one curable resin-precursor in the solvent, a phase-separated structure having a regularity in distance between phases and an uneven surface structure corresponding to the phase structure can be formed by spinodal decomposition under appropriate conditions and then curing of the precursor; and discloses that a high definition display (specifically, a liquid crystal display having a resolution of 150 ppi) equipped with the anti-glare layer having the regular phase-separation structure can effectively prevent (or subdue) sparkling of transmitted images and blur of characters. In particular, this document states that the bicontinuous structure is formed along with the progress of the phase separation, and further proceeding of the phase separation makes a droplet phase structure, that a droplet phase structure having at least an island domain is favorable in view of forming the uneven surface structure and of improving the hardness of the surface, and that the island domain can form an uneven surface structure on the anti-glare layer after drying. This document also discloses that the drying temperature for inducing the phase separation by spinodal decomposition may be a temperature lower than the boiling point of the solvent (for example, may be selected from the range of about 30 to 200° C.) and is preferably 40 to 80° C.; in Examples, the drying temperature is 60° C. or 80° C.

Japanese Patent Application Laid-Open Publication No. 2008-225195 (JP-2008-225195A; see Claims, paragraphs [0068], [0069], [0074] and [0075], and Examples) discloses an anti-glare film comprising a cured product of a (meth) acrylic resin having a weight-average molecular weight of 30000 to 1000000, a (meth)acrylic resin having a weight-average molecular weight of 1000 to 100000 and a polymerizable group, and a polyfunctional (meth)acrylate, the anti-glare film having a ridge with an average width of 0.1 to 30 μm formed dispersively in a random direction on a surface thereof, wherein the total ridge area is not more than 50% of a whole surface area of the anti-glare film. This document also discloses that a droplet phase structure having at least an island domain is favorable and that the island domain can form an uneven surface structure on the anti-glare film after drying. Further, the document states that, in order to induce convection and phase separation, a coating composition is preferably allowed to stand for a predetermined time at an ambient temperature or room temperature and then dried at a temperature lower than a boiling point of a solvent (for example, at a temperature of about 30 to 200° C., particularly preferably about 40 to 80° C.); in Examples of the document, a coating composition is allowed to stand for 10 seconds at a room temperature and then dried in an explosion-proof oven at 60° C. or 70° C. at a wind speed of 3 m/minute.

Unfortunately, these anti-glare films described in JP-4377578B and JP-2008-225195A cannot reduce sparkling while maintaining anti-glareness when disposed on a high definition display having a resolution of higher than 150 ppi (for example, a liquid crystal display or organic EL display having a resolution of not lower than 200 ppi). In particular, generally, a larger distance between a display surface and an anti-glare layer tends to promote easier generation of sparkling. A protective film for a display [a film to be attached to a surface of a display by a purchaser or a user] has an adhesive layer, which extends the distance between the display surface and the anti-glare layer; it is difficult to prevent sparkling. In addition, among high definition displays, an organic EL panel, having a high luminescence intensity of pixel, easily shows sparkling and has a difficulty in achieving both anti-glareness and prevention of blurred characters. These anti-glare films described in JP-4377578B and JP-2008-225195A cannot achieve well-balanced combination of both characteristics.

SUMMARY OF THE INVENTION

It is therefore an object of the present invention to provide an anti-glare film that achieves well-balanced haze and clarity (or image clarity) and has improved anti-glareness, highly prevented (subdued) sparkling and prevented blur of characters when disposed on a high definition display (for example, a liquid crystal display having a resolution of not less than 200 ppi or an organic EL display), as well as to provide a process for producing the anti-glare film.

Another object of the present invention is to provide an anti-glare film that achieves both anti-glareness and sparkling resistance when disposed apart from a display surface of a high definition display such as an organic EL panel (or an organic EL display) and has improved abrasion resistance (or scratch resistance), as well as to provide a process for producing the anti-glare film.

The inventors of the present invention firstly examined a mechanism regarding the fact that a conventional anti-glare film formed by spinodal decomposition of resin components incompatible with each other failed to strike a balance between anti-glareness and sparkling resistance when the anti-glare film is disposed on a high definition display. A conventional uneven structure due to phase separation mainly has a droplet phase structure relatively periodically arranged, as described in FIG. 1. The phase separation is a phenomenon that takes place as follows: a thermodynamically stable resin mixture homogeneously dissolved in a coating liquid becomes thermodynamically unstable by the evaporation of a solvent, which induces spinodal decomposition. The whole system becomes a thermodynamically unstable state simultaneously, and a homogeneous phase separation is developed within a coating film. Accordingly, the process is characterized in that the surface having a relatively periodically and uniformly uneven structure (or relatively periodically and uniformly sized recesses and projections) is obtained. In a case where an anti-glare film has a finely uneven surface structure so that sparkling can be prevented for a pixel size corresponding to a resolution of not less than 200 ppi, the anti-glare film has a low anti-glareness and results in a decrease in image quality because of the reflection of an ambient light on a display surface. In contrast, in a case where an anti-glare film has projections with larger incident angles in order to improve anti-glareness, the anti-glare film has an increased haze and blur of characters is induced.

It is generally considered that sparkling is generated due to a lens effect in a case where a degree of a pitch of an uneven structure is close to that of a pixel size. Probably, in a case where the pitch of the uneven structure strides the pixel, the transmitted lights of respective pixels are refracted in different directions due to the uneven structure. Thus the color or brightness to be essentially reached observer's eyes as a color mixture of RGB is changed randomly according to the pitch or inclination (or slope) of the uneven structure, and the feeling due to this phenomenon is recognized as sparkling. In a case where the pitch of the uneven structure is significantly smaller than the pixel, recesses or projections striding the pixel are present in a low ratio and only induces small refraction. Thus sparkling is hardly felt. In contrast, in a case where the pitch of the uneven structure is significantly larger than the pixel, an uneven structure having a larger inclination (or slope) greatly refracts a transmitted light to induce a lens effect, while an uneven structure having a smaller inclination (or slope) slightly refracts a transmitted light to reduce feeling of sparkling. For easier understanding, an extreme case is given as follows: in a case where the angle of inclination of the uneven structure is sufficiently near zero, the surface having the uneven structure is almost a plane, thus it is estimated that sparkling disappears.

The inventors of the present invention found that sparkling is easily generated in the conventional anti-glare film due to a droplet phase structure thereof, and focused attention on a bicontinuous phase structure (bicontinuous structure or bicontinuous-shaped phase-separation structure). Specifically, for a phase-separation structure containing a bicontinuous phase structure, a protruded portion forming the bicontinuous phase structure is adjusted to a width sufficiently smaller than a pixel, depending on the pixel size, so that a factor generating sparkling is removed in the width direction. Meanwhile, in the length (continuous length)

direction of the protruded portion, sparkling is hardly generated because the inclination is absent except the ends of the protruded portion in principle. In particular, for a droplet phase structure without limitation to the bicontinuous phase structure, since a longer island domain makes a proportion of the ends smaller, sparkling is further hardly generated. Moreover, since the bicontinuous phase structure or long island domain is greatly extended in a film surface direction in spite of a small width of the protruded portion or long island domain, anti-glareness is easily achieved. Further, since the bicontinuous phase structure essentially has few inclination portions, which are factors scattering light, the bicontinuous phase structure hardly generates blur of characters due to a low haze thereof compared with a droplet uneven surface structure having a size in the length direction almost the same as a size in the width direction.

The inventors of the present invention made extensive studies to achieve the above objects based on these findings and finally found that an anti-glare layer densely having a ridge on a surface thereof, in which the ridge is formed by phase separation of a plurality of resin components and has a branched structure and a total length of not less than 100 μm, achieves well-balanced haze and image clarity, and has improved anti-glareness, highly prevented sparkling and prevented blur of characters when disposed on a high definition display (for example, a liquid crystal display having a resolution of not less than 200 ppi or an organic EL display); thus the present invention was accomplished.

That is, the anti-glare film of the present invention comprises an anti-glare layer having a ridge on a surface thereof, the ridge being formed by phase separation of a plurality of resin components; the ridge has a branched structure and a total length of not less than 100 μm, and one or more ridges per square millimeter exist on the surface of the anti-glare layer. The ridge may form a bicontinuous phase structure, and the bicontinuous phase structure may have a net-like (or network-like) pattern with an average diameter of each net-like pattern (or cell) of 1 to 70 μm. In the surface of the anti-glare layer, the length ratio of the ridge having a branched structure relative to a projection (or protruded portion) other than the ridge having a branched structure may be about 100/0 to 50/50 in a ratio of the former/the latter. The anti-glare film of the present invention may have a transmitted image clarity of 70 to 100% measured with an image clarity measuring apparatus provided with an optical slit of 0.5 mm width, a haze of 10 to 40%, and a total light transmittance of 70 to 100%. The plurality of resin components may contain a plurality of polymers selected from the group consisting of a styrenic resin, a (meth)acrylic resin, an alicyclic olefinic resin, a polyester-series resin, an aliphatic organic acid cellulose ester, and an aromatic organic acid cellulose ester, and at least one curable resin-precursor selected from the group consisting of an epoxy (meth)acrylate, a urethane (meth)acrylate, a polyester (meth)acrylate, a silicone (meth)acrylate, and a polyfunctional monomer having at least two polymerizable unsaturated bonds, wherein at least two components among the polymers may be phase-separated by spinodal decomposition from a liquid phase, and the curable resin-precursor may be cured. The curable resin-precursor may contain a low-viscous curable resin-precursor having a viscosity (25° C.) of not higher than 3000 mPa·s in accordance with JIS (Japanese Industrial Standards) Z8803. The anti-glare film of the present invention may subdue sparkling in a case where the anti-glare layer is disposed on a display having a resolution of 200 ppi at a distance of not less than 0.05 mm from a display surface. The display may be an organic EL display. The anti-glare film of the present invention may further comprise a transparent film, wherein a first side of the transparent film has the anti-glare layer. In the anti-glare film, a second side of the transparent film may have an adhesive layer. The anti-glare film of the present invention may be a protective film to be disposed on an outermost surface of a display (in particular, an organic EL display).

The present invention also includes a process for producing the anti-glare film, which comprises the steps of: applying a liquid composition containing a plurality of resin components and a solvent on a support, and drying the applied liquid composition to form a phase-separation structure by spinodal decomposition with evaporation of the solvent. The drying step may be carried out at a temperature higher than 80° C.

As used herein, the terms "(meth)acrylic", "(meth)acrylate" and "(meth)acrylic acid" means "acrylic or methacrylic", "acrylate or methacrylate" and "acrylic acid or methacrylic acid", respectively.

DETAILED DESCRIPTION OF THE INVENTION

[Anti-Glare Layer]

Figure 1:
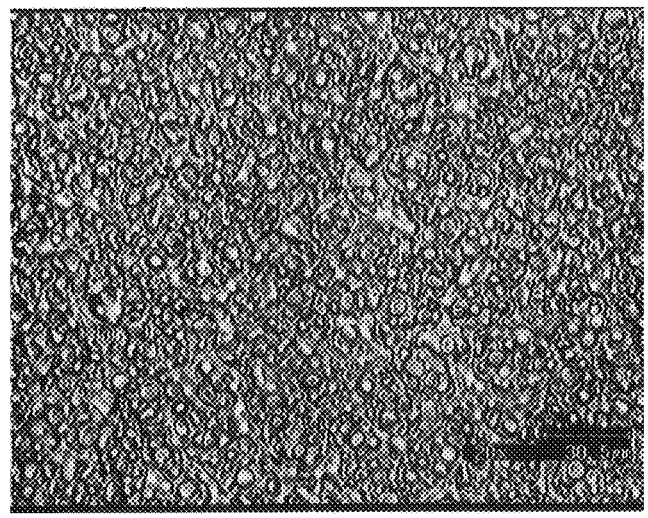
FIG. 1 represents a laser reflection microscope photograph of a surface of an anti-glare layer of a conventional anti-glare film obtained using spinodal decomposition of resin components incompatible with each other (an anti-glare film obtained in Comparative Example 2).

The anti-glare film of the present invention contains an anti-glare layer. The anti-glare layer has a surface having a long and narrow (or long size) protruded portion (a ridge) formed by phase separation of a plurality of resin components; the anti-glare film shows anti-glareness due to the uneven surface structure formed by the ridge. In particular, according to the present invention, since the ridge has a branched structure and a total length of not less than 100 μm and forms a bicontinuous phase structure in a dense state on a surface of the anti-glare layer, the anti-glare film achieves well-balanced haze and image clarity, high prevention of sparkling and prevention of blur of characters without decrease of anti-glareness even when disposed on a high definition display.

(Ridge)

The ridge is formed by phase separation of a plurality of resin components according to the process described below. The ridge [long and narrow (strip-shaped or linear) protruded portion] forms a net-like or network-like pattern (or structure) on a surface of the anti-glare layer. Thus the surface of the anti-glare layer visually has a two-dimensional network pattern (a net-like pattern like rind of muskmelon), that is, a pattern having a plurality of irregular loops (for example, continuous loops or incomplete (discontinuous) loops).

Specifically, it is sufficient that the surface of the anti-glare layer has one or more ridges per square millimeter; each ridge having a branched structure has a total length of not less than 100 μm (preferably not less than 200 μm, and more preferably not less than 500 µm). The surface of the anti-glare layer may have a plurality of the ridges. In a case where the whole surface of the anti-glare layer has a bicontinuous phase structure, having a branched structure has an infinite length; the number of the ridge is 1 irrespective of the area in which the number of the ridge is counted. The term "total length" of a ridge means a total length, including all branches, in a continuous ridge.

It is sufficient that the branched structure of the ridge has at least one branch. The ridge is preferably branched in a net-like pattern and forms a bicontinuous phase structure (bicontinuous structure or bicontinuous phase-separation structure). As used herein, the term "bicontinuous phase structure" means a continuous structure (or a net-like structure) in which protruded droplet-like portions initially (or originally) generated in the phase separation process are united in the drying process of the production.

It is not necessary that all ridges have a bicontinuous phase structure; the surface of the anti-glare layer may have an initial (or original) droplet protruded portion (that is, a ridge free from a branch, or a non-ridge such as a substantially circular protruded portion or an elliptical protruded portion). According to the present invention, since the proportion of ends is low in the ridge compared with an island-like protruded portion of a droplet phase structure (or islands-in-the-sea structure), the anti-glare layer can prevent sparkling or blur of characters (or blurry text). Further, for the bicontinuous phase structure formed by phase separation of resin components, since the inclination (or slope) of the ends is small, the anti-glare layer can prevent sparkling or blur of characters (or blurry text).

In the surface of the anti-glare layer, the length ratio of the ridge having a branched structure relative to a protruded portion other than the ridge (an initial droplet protruded portion) may be selected from the range of, for example, about 100/0 to 10/90, and may be, e.g., about 100/0 to 30/70 (e.g., about 99/1 to 30/70), preferably about 100/0 to 50/50 (e.g., about 95/5 to 50/50), and more preferably about 100/0 to 70/30 (particularly, about 100/0 to 90/10) in a ratio of the former/the latter. In particular, the ridge is preferably substantially 100% (for example, the whole surface (or whole area) of the anti-glare layer has a bicontinuous phase structure). A higher proportion of the ridge in the whole protruded portion is preferable; where the whole protruded portion contains the ridge and the protruded portion other than the ridge. The proportion of the length of the ridge in the total length of the whole protruded portion (where the total length of the whole protruded portion means the total of the length of the ridge and that of the protruded portion other than the ridge) is usually not less than 50% (e.g., 50 to 90%). In a case where the length ratio is small and the proportion of the ridge having a branched structure is excessively low, the proportion of the droplet phase structure is high; the improvement of anti-glareness is liable to cause sparkling or blur of characters.

The bicontinuous phase structure formed by the ridge is usually composed of irregular-shaped net-like patterns with a similar diameter of each net-like pattern (cell). The bicontinuous phase structure may have, for example, a net-like pattern with an average diameter of each net-like pattern of about 1 to 70 µm (e.g., about 1 to 40 µm), preferably about 2 to 50 µm (e.g., about 3 to 30 µm), and more preferably about 5 to 20 µm (particularly, about 10 to 20 µm); in a case where each net-like pattern of the bicontinuous phase structure is in an anisotropic form (such as an elliptical form or a rectangular form), the average diameter refers to the average value of the major axis and the minor axis. An excessively large diameter of each net-like pattern is liable to cause sparkling or blur of characters, while an excessively small diameter thereof is liable to decrease anti-glareness.

The form of the ridge (the two-dimensional form of the surface of the anti-glare layer) is usually a strip-shaped (linear or fiber-shaped) form partly or wholly having a curved portion. The ridge has an average width of 0.1 to 30 µm, and may be adjusted to a small average width selected from the above range according to a pixel of a display so that sparkling can be prevented. For example, the ridge may have an average width of about 0.1 to 20 µm, preferably about 0.1 to 15 µm, and more preferably about 0.1 to 10 µm (in particular, about 0.1 to 5 µm). An excessively large width of the ridge is liable to cause sparkling or blur of characters, while an excessively small width of the ridge causes decrease of anti-glareness. In a case where a droplet protruded portion is united to another droplet protruded portion, the surface of each droplet protruded portion is deformed so that the boundary tension can be optimized. Thus the width of the ridge having a bicontinuous phase structure, which is formed by uniting the droplet protruded portions, is not necessarily the same as the size of the initial droplet protruded portion.

The ridge has an average height of, for example, about 0.05 to 10 µm, preferably about 0.07 to 5 µm, and more preferably about 0.09 to 3 µm (particularly, about 0.1 to 2 µm). The ridge has an angle of inclination of, for example, not more than 10°, preferably about 0.5 to 5°, and more preferably about 1 to 3°. A ridge having a larger height and a larger angle of inclination is liable to cause sparkling or blur of characters.

The proportion of the area of the whole protruded portion in the surface of the anti-glare layer is, for example, about 10 to 99.9% (e.g., about 30 to 99.80), preferably about 50 to 99.5% (e.g., about 80 to 99%), and more preferably about 90 to 99% (particularly, about 95 to 980). An excessively small area between ridges is liable to decrease anti-glareness, while an excessively large area between ridges is liable to cause sparkling or blur of characters.

As used herein, the size or form (e.g., the presence or absence of branches) of the ridge and the area of the ridge can be measured or evaluated based on a two-dimensional form (or pattern) observed in a microscope photograph. Moreover, the average value is the average of measurements at any 10 or more points. The length ratio of the ridge relative to the protruded portion other than the ridge can be determined by measuring each length of the ridge and the protruded portion in an area of 1 mm². In particular, since the ridge (or bicontinuous phase structure) in the present invention has a continuous structure formed by uniting (or joining) droplet phases, the form of each ridge is distinguishable based on a ridge line (edge line), which is a line along peaks of protruded portions, by microscopic observation. Further, as used herein, the length of the ridge can be measured as a length of the above-mentioned ridge line; the diameter of each net-like pattern of the bicontinuous phase structure can be determined based on the ridge line. Specifically, these can be measured according to the method described in the after-mentioned Examples. The angle of inclination of the ridge can be measured by a profiling surface texture and contour measuring instrument (manufactured by Tokyo Seimitsu Co., Ltd., "SURFCOM") in accordance with JIS.

(Resin Component)

The anti-glare layer contains a plurality of resin components being capable of phase separation. The phase-separation structure of the anti-glare layer is formed by spinodal decomposition from a liquid phase (wet spinodal decomposition). It is sufficient that the plurality of resin components contain phase-separable resin components. In order to form the ridge described above and improve abrasion resistance, the resin component preferably contains a polymer component and a curable resin-precursor.

(Polymer Component)

As a polymer component, a thermoplastic resin is usually employed. As the thermoplastic resin, there may be exemplified a styrenic resin, a (meth)acrylic resin, an organic acid vinyl ester-series resin, a vinyl ether-series resin, a halogen-containing resin, an olefinic resin (including an alicyclic olefinic resin), a polycarbonate-series resin, a polyester-series resin, a polyamide-series resin, a thermoplastic polyurethane resin, a polysulfone-series resin (e.g., a polyether sulfone and a polysulfone), a polyphenylene ether-series resin (e.g., a polymer of 2,6-xylenol), a cellulose derivative (e.g., a cellulose ester, a cellulose carbamate, and a cellulose ether), a silicone resin (e.g., a polydimethylsiloxane and a polymethylphenylsiloxane), a rubber or elastomer (e.g., a diene-series rubber such as a polybutadiene or a polyisoprene, a styrene-butadiene copolymer, an acrylonitrile-butadiene copolymer, an acrylic rubber, a urethane rubber, and a silicone rubber), and the like. These thermoplastic resins may be used alone or in combination.

The styrenic resin may include a homo- or copolymer of a styrenic monomer (e.g. a polystyrene, a styrene-α-methylstyrene copolymer, and a styrene-vinyl toluene copolymer), and a copolymer of a styrenic monomer and other polymerizable monomer [e.g., a (meth)acrylic monomer, maleic anhydride, a maleimide-series monomer, and a diene]. The styrenic copolymer may include, for example, a styrene-acrylonitrile copolymer (AS resin), a copolymer of styrene and a (meth)acrylic monomer [e.g., a styrene-methyl methacrylate copolymer, a styrene-methyl methacrylate-(meth)acrylate copolymer, and a styrene-methylmethacrylate-(meth)acrylic acid copolymer], and a styrene-maleic anhydride copolymer. The preferred styrenic resin includes a polystyrene, a copolymer of styrene and a (meth)acrylic monomer [e.g., a copolymer comprising styrene and methyl methacrylate as main units, such as a styrene-methyl methacrylate copolymer], an AS resin, a styrene-butadiene copolymer, and the like.

As the (meth)acrylic resin, a homo- or copolymer of a (meth)acrylic monomer and a copolymer of a (meth)acrylic monomer and a copolymerizable monomer may be employed. As the (meth)acrylic monomer, there may be mentioned, for example, (meth)acrylic acid; a $C_{1-10}$alkyl (meth)acrylate such as methyl(meth)acrylate, ethyl(meth) acrylate, butyl(meth)acrylate, t-butyl(meth)acrylate, isobutyl(meth)acrylate, hexyl(meth)acrylate, octyl(meth)acrylate or 2-ethylhexyl(meth)acrylate; an aryl(meth)acrylate such as phenyl(meth)acrylate; a hydroxyalkyl(meth)acrylate such as hydroxyethyl(meth)acrylate or hydroxypropyl(meth)acrylate; glycidyl(meth)acrylate; an N,N-dialkylaminoalkyl (meth)acrylate; (meth)acrylonitrile; and a (meth)acrylate having an alicyclic hydrocarbon group (such as tricyclodecane). The copolymerizable monomer may include the above styrenic monomer, a vinyl ester-series monomer, maleic anhydride, maleic acid, and fumaric acid. These monomers may be used alone or in combination.

As the (meth)acrylic resin, there may be mentioned, for example, a poly(meth)acrylate such as a poly(methyl methacrylate), a methyl methacrylate-(meth)acrylic acid copolymer, a methyl methacrylate-(meth)acrylate copolymer, a methyl methacrylate-acrylate-(meth)acrylic acid copolymer, and a (meth)acrylate-styrene copolymer (e.g., a MS resin). The preferred (meth)acrylic resin includes a poly($C_{1-6}$alkyl (meth)acrylate) such as a poly(methyl(meth)acrylate), particularly a methyl methacrylate-series resin containing methyl methacrylate as a main component (about 50 to 100% by weight, and preferably about 70 to 100% by weight).

As the organic acid vinyl ester-series resin, there may be mentioned a homo- or copolymer of a vinyl ester-series monomer (e.g., a poly(vinyl acetate) and a poly(vinyl propionate)), a copolymer of a vinyl ester-series monomer and a copolymerizable monomer (e.g., an ethylene-vinyl acetate copolymer, a vinyl acetate-vinyl chloride copolymer, and a vinyl acetate-(meth)acrylate copolymer), or a derivative thereof. The derivative of the vinyl ester-series resin may include a poly(vinyl alcohol), an ethylene-vinyl alcohol copolymer, a poly(vinyl acetal) resin, and the like.

As the vinyl ether-series resin, a homo- or copolymer of a vinyl $C_{1-10}$alkyl ether such as vinyl methyl ether, vinyl ethyl ether, vinyl propyl etherorvinyl t-butyl ether, and a copolymer of a vinyl $C_{1-10}$alkyl ether and a copolymerizable monomer (e.g., a vinyl alkyl ether-maleic anhydride copolymer).

The halogen-containing resin may include a poly(vinyl chloride), a poly(vinylidene fluoride), a vinyl chloride-vinyl acetate copolymer, a vinyl chloride-(meth)acrylate copolymer, a vinylidene chloride-(meth)acrylate copolymer, and the like.

The olefinic resin may include, for example, an olefinic homopolymer such as a polyethylene or a polypropylene, and a copolymer such as an ethylene-vinyl acetate copolymer, an ethylene-vinyl alcohol copolymer, an ethylene-(meth)acrylic acid copolymer or an ethylene-(meth)acrylate copolymer. As the alicyclic olefinic resin, there may be mentioned a homo- or copolymer of a cyclic olefin such as norbornene or dicyclopentadiene (e.g., a polymer having an alicyclic hydrocarbon group such as tricyclodecane which is sterically rigid), a copolymer of the cyclic olefin and a copolymerizable monomer (e.g., an ethylene-norbornene copolymer and a propylene-norbornene copolymer). The alicyclic olefinic resin is available as, for example, the trade name "ARTON", the trade name "ZEONEX" and the like.

The polycarbonate-series resin may include an aromatic polycarbonate based on a bisphenol (e.g., bisphenol A), an aliphatic polycarbonate such as diethylene glycol bisallyl carbonate, and others.

The polyester-series resin may include an aromatic polyester obtainable from an aromatic dicarboxylic acid such as terephthalic acid [for example, a homopolyester, e.g., a poly($C_{2-4}$alkylene terephthalate) such as a poly(ethylene terephthalate) or a poly(butylene terephthalate), a poly($C_{2-4}$alkylene naphthalate); and a copolyester comprising a $C_{2-4}$alkylene arylate unit (a $C_{2-4}$alkylene terephthalate unit and/or a $C_{2-4}$alkylene naphthalate unit) as a main component (e.g., not less than 50% by weight)]. The copolyester may include a copolyester in which, in constituting units of a poly($C_{2-4}$alkylene arylate), part of $C_{2-4}$alkylene glycols is substituted with a polyoxy$C_{2-4}$alkylene glycol, a $C_{6-10}$alkylene glycol, an alicyclic diol (e.g., cyclohexane dimethanol and hydrogenated bisphenol A), a diol having an aromatic ring (e.g., 9,9-bis(4-(2-hydroxyethoxy)phenyl) fluorene having a fluoronone side chain, a bisphenol A, and a bisphenol A-alkylene oxide adduct) or the like, and a copolyester in which, in constituting units, part of aromatic dicarboxylic acids is substituted with an unsymmetric aromatic dicarboxylic acid such as phthalic acid or isophthalic acid, an aliphatic $C_{6-12}$dicarboxylic acid such as adipic acid, or the like. The polyester-series resin may also include a polyarylate-series resin, an aliphatic polyester obtainable from an aliphatic dicarboxylic acid such as adipic acid, and a homo- or copolymer of a lactone such as ε-caprolactone. The preferred polyester-series resin is usually a non-crystalline resin, such as a non-crystalline copolyester (e.g., a $C_{2-4}$alkylene arylate-series copolyester).

The polyamide-series resin may include an aliphatic polyamide such as a nylon 46, a nylon 6, a nylon 66, a nylon 610, a nylon 612, a nylon 11 or a nylon 12, and a polyamide obtainable from a dicarboxylic acid (e.g., terephthalic acid, isophthalic acid, and adipic acid) and a diamine (e.g., hexamethylenediamine and metaxylylenediamine). The polyamide-series resin may be a homo- or copolymer of a lactam such as ε-caprolactam and is not limited to a homopolyamide but may be a copolyamide.

Among the cellulose derivatives, the cellulose ester may include, for example, an aliphatic organic acid ester of a cellulose [e.g., a $C_{1-6}$organic acid ester of a cellulose such as a cellulose acetate (e.g., a cellulose diacetate and a cellulose triacetate), a cellulose propionate, a cellulose butyrate, a cellulose acetate propionate, or a cellulose acetate butyrate], an aromatic organic acid ester of a cellulose (e.g. a $C_{7-12}$aromatic carboxylic acid ester of a cellulose such as a cellulose phthalate or a cellulose benzoate), an inorganic acid ester of a cellulose (e.g., a cellulose phosphate and a cellulose sulfate) and may be a mixed acid ester of a cellulose such as a cellulose acetate nitrate. The cellulose derivative may also include a cellulose carbamate (e.g. a cellulose phenylcarbamate), a cellulose ether (e.g., a cyanoethylcellulose; a hydroxy$C_{2-4}$alkyl cellulose such as a hydroxyethyl cellulose or a hydroxypropyl cellulose; a $C_{1-6}$alkyl cellulose such as a methyl cellulose or an ethyl cellulose; a carboxymethyl cellulose or a salt thereof, a benzyl cellulose, and an acetyl alkyl cellulose).

The preferred thermoplastic resin includes, for example, a styrenic resin, a (meth)acrylic resin, a vinyl acetate-series resin, a vinyl ether-series resin, a halogen-containing resin, an alicyclic olefinic resin, a polycarbonate-series resin, a polyester-series resin, a polyamide-series resin, a cellulose derivative, a silicone-series resin, and a rubber or elastomer, and the like. As the resin, there is usually employed a resin that is non-crystalline and is soluble in an organic solvent (particularly a common solvent for dissolving a plurality of polymers or curable compounds). In particular, a resin that is excellent in moldability or film-forming (film-formable) properties, transparency, and weather resistance [for example, a styrenic resin, a (meth)acrylic resin, analicyclicolefinic resin, apolyester-series resin, and a cellulose derivative (e.g., a cellulose ester)] is preferred.

As the polymer component, there may be also used a polymer having a functional group participating (or being involved) in a curing reaction (or a functional group capable of reacting with the curable compound). The polymer may have the functional group in a main chain thereof or in a side chain thereof. The functional group may be introduced into a main chain of the polymer with co-polymerization, co-condensation or the like and is usually introduced into a side chain of the polymer. Such a functional group may include a condensable group or a reactive group (for example, a hydroxyl group, an acid anhydride group, a carboxyl group, an amino or an imino group, an epoxy group, a glycidyl group, and an isocyanate group), a polymerizable group [for example, a $C_{2-6}$alkenyl group such as vinyl, propenyl, isopropenyl, butenyl or allyl, a $C_{2-6}$alkynyl group such as ethynyl, propynyl or butynyl, a $C_{2-6}$alkenylidene group such as vinylidene, or a group having the polymerizable group(s) (e.g., (meth)acryloyl group)], and others. Among these functional groups, the polymerizable group is preferred.

As a process for introducing the polymerizable group in a side chain of the polymer component, for example, there may be utilized a process of allowing a thermoplastic resin having a functional group (such as a reactive group or condensable group) to react with a polymerizable compound having a group reactive to the functional group.

Exemplified as the thermoplastic resin having a functional group is a thermoplastic resin having a carboxyl group or an acid anhydride group thereof (e.g., a (meth)acrylic resin, a polyester-series resin, and a polyamide-series resin), a thermoplastic resin having a hydroxyl group (e.g., a (meth)acrylic resin, a polyurethane-series resin, a cellulose derivative, and a polyamide-series resin), a thermoplastic resin having an amino group (e.g., a polyamide-series resin), a thermoplastic resin having an epoxy group (e.g., a (meth)acrylic resin or polyester-series resin having an epoxy group), and others. Moreover, such a resin may also be a resin in which the functional group is introduced into a thermoplastic resin (such as a styrenic resin, an olefinic resin, and an alicyclic olefinic resin) with co-polymerization or graft polymerization.

As the polymerizable compound, for a thermoplastic resin having a carboxyl group or an acid anhydride group thereof, there may be used a polymerizable compound having an epoxy group, a hydroxyl group, an amino group, an isocyanate group or the like. For a thermoplastic resin having a hydroxyl group, there may be mentioned a polymerizable compound having a carboxyl group or an acid anhydride group thereof, an isocyanate group or the like. For a thermoplastic resin having an amino group, there may be mentioned a polymerizable compound having a carboxyl group or an acid anhydride group thereof, an epoxy group, an isocyanate group or the like. For thermoplastic resin having an epoxy group, there may be mentioned a polymerizable compound having a carboxyl group or an acid anhydride group thereof, an amino group or the like.

Among the above-mentioned polymerizable compounds, as the polymerizable compound having an epoxy group, for example, there may be mentioned an epoxycyclo$C_{5-8}$alkenyl (meth)acrylate such as epoxycyclohexenyl(meth)acrylate, glycidyl(meth)acrylate, and allyl glycidyl ether. As the compound having a hydroxyl group, for example, there may be mentioned a hydroxy$C_{1-4}$alkyl(meth)acrylate such as hydroxypropyl(meth)acrylate, and a $C_{2-6}$alkylene glycol (meth)acrylate such as ethylene glycol mono(meth)acrylate. As the polymerizable compound having an amino group, for example, there may be mentioned an amino$C_{1-4}$alkyl(meth) acrylate such as aminoethyl(meth)acrylate, a $C_{3-6}$alkenylamine such as allylamine, and an aminostyrene such as 4-aminostyrene or diaminostyrene. As the polymerizable compound having an isocyanate group, for example, there may be mentioned a polyurethane(meth)acrylate and vinyl isocyanate. As the polymerizable compound having a carboxyl group or an acid anhydride group thereof, for example, there may be mentioned an unsaturated carboxylic acid or anhydride thereof such as a (meth)acrylic acid or maleic anhydride.

As typical examples, the following combinations are included: a thermoplastic resin having a carboxyl group or an acid anhydride group thereof, and an epoxy group-containing compound; particularly a (meth)acrylic resin [e.g., a (meth)acrylic acid-(meth)acrylic ester copolymer] and an epoxy group-containing (meth)acrylate [e.g., an epoxycycloalkenyl(meth)acrylate, and a glycidyl(meth) acrylate]. Concretely, there may be used a polymer in which a polymerizable unsaturated group(s) is(are) incorporated in one or some of carboxyl groups of a (meth)acrylic resin, for example, a (meth)acrylic polymer having in a side chain thereof a photo-polymerizable unsaturated group(s) introduced by allowing epoxy group(s) of 3,4-epoxycyclohexenyl methyl acrylate to react with one or some of carboxyl groups of a (meth)acrylic acid-(meth)acrylate copolymer.

The introduction amount of the functional group (particularly the polymerizable group) that participates in (or being involved in) a curing reaction of the thermoplastic resin is about 0.001 to 10 mol, preferably about 0.01 to 5 mol, and more preferably about 0.02 to 3 mol relative to 1 kg of the thermoplastic resin.

The polymer (s) may be used in a suitable combination. That is, the polymer may comprise a plurality of polymers. The plurality of polymers may be capable of phase separation by spinodal decomposition from a liquid phase. Moreover, the plurality of polymers may be incompatible with each other. For a combination of a plurality of polymers, the combination of a first resin with a second resin is not particularly limited to a specific one, and a plurality of polymers incompatible with each other in the neighborhood of a processing temperature, for example two polymers incompatible with each other, may be used in a suitable combination. For example, when the first resin is a styrenic resin (e.g., a polystyrene, a styrene-acrylonitrile copolymer), the second resin may be a cellulose derivative (e.g., a cellulose ester such as a cellulose acetate propionate), a (meth)acrylic resin (e.g., a poly(methyl methacrylate)), an alicyclic olefinic resin (e.g., a polymer comprising a norbornene unit as a monomer unit), a polycarbonate-series resin, a polyester-series resin (e.g., the above-mentioned poly($C_{2-4}$alkylene arylate)-series copolyester), and others. Moreover, for example, when a first polymer is a cellulose derivative (e.g., a cellulose ester such as cellulose acetate propionate), a second polymer may be a styrenic resin (e.g., a polystyrene, a styrene-acrylonitrile copolymer), a (meth)acrylic resin, an alicyclic olefinic resin (e.g., a polymer comprising a norbornene unit as a monomer unit), a polycarbonate-series resin, a polyester-series resin (e.g., the above-mentioned poly($C_{2-4}$alkylene arylate)-series copolyester), and others. In the combination of a plurality of resins, there may be used at least a cellulose ester (for example, $C_{2-4}$alkylcarboxylic acid ester of a cellulose such as a cellulose diacetate, a cellulose triacetate, a cellulose acetate propionate, or a cellulose acetate butyrate).

The phase-separation structure generated by spinodal decomposition is finally cured with an actinic ray (e.g., an ultraviolet ray, an electron beam), heat, or other means to form a cured resin. Accordingly, the cured resin can impart abrasion resistance and improved durability to the anti-glare layer.

From the viewpoint of abrasion resistance after curing, at least one of the plurality of polymers, e.g., one of polymers incompatible with each other (in the case of using a first resin with a second resin in combination, particularly both polymers) is preferably a polymer having a functional group that is reactive to the curable resin-precursor, in a side chain thereof.

The ratio (weight ratio) of the first polymer relative to the second polymer [the former/the latter] may be selected within the range of, for example, about 1/99 to 99/1, preferably about 5/95 to 95/5 and more preferably about 10/90 to 90/10, and is usually about 20/80 to 80/20, particularly about 30/70 to 70/30.

The polymer for forming a phase-separation structure may comprise the thermoplastic resin or other polymers in addition to the above-mentioned two polymers incompatible with each other.

The glass transition temperature of the polymer may be selected within the range of, for example, about −100° C. to 250° C., preferably about −50° C. to 230° C., and more preferably about 0° C. to 200° C. (for example, about 50° C. to 180° C.). It is advantageous from the viewpoint of surface hardness that the glass transition temperature is not lower than 50° C. (e.g., about 70° C. to 200° C.) and preferably not lower than 100° C. (e.g., about 100° C. to 170° C.). The weight-average molecular weight of the polymer may be selected within the range of, for example, not more than 1,000,000, and preferably about 1,000 to 500,000.

(Curable Resin-Precursor)

As the curable resin-precursor, there may be used various curable compounds having a reactive functional group to heat or an actinic ray (e.g., an ultraviolet ray, and an electron beam) and being capable of forming a resin (particularly a cured or a crosslinked resin) by curing or crosslinking with heat or an actinic ray. For example, as the resin-precursor, there may be mentioned a thermosetting compound or resin [for example, a low molecular weight compound having an epoxy group, a polymerizable group, an isocyanate group, an alkoxysilyl group, a silanol group, or others (e.g., an epoxy-series resin, an unsaturated polyester-series resin, a urethane-series resin, and a silicone-series resin)], and a photo-curable compound that is curable with an actinic ray (such as ultraviolet ray) (e.g., an photo-curable compound such as a photo-curable monomer or oligomer). The photo-curable compound may be an EB (electron beam)-curable compound, or others. Incidentally, a photo-curable compound such as a photo-curable monomer, a photo-curable oligomer, or a photo-curable resin which may have a low molecular weight is sometimes simply referred to as "photo-curable resin".

The photo-curable compound may include, for example, a monomer and an oligomer (or a resin, particularly a resin having a low molecular weight). As the monomer, there may be mentioned, for example, a monofunctional monomer [for example, a (meth)acrylic monomer (e.g., a (meth)acrylate), a vinyl-series monomer (e.g., vinylpyrrolidone), and a (meth)acrylate having a crosslinked cyclic hydrocarbon group (e.g., isobornyl (meth)acrylate and adamantyl(meth) acrylate)], and a polyfunctional monomer having at least two polymerizable unsaturated groups [for example, an alkylene glycol di(meth)acrylate such as ethylene glycol di(meth)acrylate, propylene glycol di(meth)acrylate, butanediol di(meth)acrylate, neopentyl glycol di(meth)acrylate, or hexanediol di(meth)acrylate; a (poly)oxyalkylene glycol di(meth)acrylate such as diethylene glycol di(meth) acrylate, dipropylene glycol di(meth)acrylate, or a polyoxytetramethylene glycol di(meth)acrylate; and a di(meth) acrylate having a crosslinked cyclic hydrocarbon group (e.g., tricyclodecane dimethanol di(meth)acrylate and adamantane di(meth)acrylate); and a polyfunctional monomer having about 3 to 6 polymerizable unsaturated groups such as trimethylolpropane tri(meth)acrylate, trimethylolethane tri(meth)acrylate, pentaerythritol tri(meth)acrylate, pentaerythritol tetra(meth)acrylate, or dipentaerythritol penta (meth)acrylate].

Examples of the oligomer or resin may include a (meth) acrylate of an adduct of bisphenol A with an alkylene oxide, an epoxy(meth)acrylate (e.g., a bisphenol A-based epoxy (meth)acrylate and a novolak-based epoxy(meth)acrylate), a polyester(meth)acrylate (e.g., an aliphatic polyester-based (meth)acrylate and an aromatic polyester-based (meth)acrylate), a (poly)urethane(meth)acrylate (e.g., a polyester-based urethane(meth)acrylate and a polyether-based urethane (meth)acrylate), a silicone(meth)acrylate, and others. These photo-curable compounds may be used alone or in combination.

The preferred curable resin-precursor includes a photo-curable compound curable in a short time, for example, an ultraviolet-curable compound (e.g., a monomer, an oligomer, and a resin which may have a low molecular weight) and an EB-curable compound. In particular, a resin-precursor having a practical advantage is an ultraviolet-curable resin. Further, in order to improve resistance such as abrasion resistance, the photo-curable compound (photo-curable resin) is preferably a compound not less than 2 (preferably about 2 to 15, more preferably about 4 to 10) polymerizable unsaturated bonds in a molecule thereof. Specifically, the preferred compound includes an epoxy(meth)acrylate, a urethane(meth)acrylate, a polyester(meth)acrylate, a silicone(meth)acrylate, and a polyfunctional monomer having at least two polymerizable unsaturated bonds.

The number-average molecular weight of the curable resin-precursor is, allowing for compatibility to the polymer, not more than about 5000, preferably not more than about 2000, and more preferably not more than about 1000.

The curable resin-precursor may have a viscosity (a viscosity at 25° C. in accordance with JIS Z8803) selected from the range of about 100 to 10000 mPa·s (particularly, about 500 to 8000 mPa·s). In particular, from the aspect of easy formation of the ridge, the curable resin-precursor preferably contains a low-viscous curable resin-precursor at least having a viscosity of not more than 3000 mPa·s. The low-viscous curable resin-precursor have a viscosity (a viscosity at 25° C. in accordance with JIS 28803) of, for example, about 100 to 3000 mPa·s, preferably about 300 to 2800 mPa·s, and more preferably about 500 to 2500 mPa·s (particularly, about 1000 to 2300 mPa·s). A low-viscous curable resin-precursor having an excessively high viscosity makes it difficult to form the ridge. Although the effect of the low-viscous curable resin-precursor on the mechanism of easy formation of the ridge is not clear, it is presumed that the low-viscous curable resin-precursor improves the melting flowability of a coating composition (or a coating liquid) in a drying step (in particular, improves the degree of freedom of the thermoplastic resin to be phase-separated), thereby accelerating spinodal decomposition to make progress from a droplet phase structure to a bicontinuous phase structure.

The proportion of the low-viscous curable resin-precursor in the whole resin component can be selected from the range of about 1 to 50% by weight and may be, for example, about 3 to 40% by weight, preferably about 5 to 35% by weight, and more preferably about 10 to 30% by weight (particularly, about 15 to 25% by weight). An excessively high proportion of the low-viscous curable resin-precursor inhibits the initial formation of the uneven structure following the phase separation by spinodal decomposition and reduces an opportunity to unite (or join) protruded portions by melting, and thus it is difficult to form the ridge. An excessively low proportion thereof decreases the melting flowability of a coating composition (or a coating liquid), and thus it is difficult to form the ridge.

The curable resin-precursor may contain a curing agent depending on the variety. For example, a thermosetting resin may contain a curing agent such as an amine or a polyfunctional carboxylic acid, and a photo-curable resin may contain a photopolymerization initiator. As the photopolymerization initiator, there may be exemplified a conventional component, e.g., an acetophenone, a propiophenone, a benzyl, a benzoin, a benzophenone, a thioxanthone, an acylphosphine oxide, and others. The amount of the curing agent (such as a photo curing agent) relative to 100 parts by weight of the curable resin-precursor is about 0.1 to 20 parts by weight, preferably about 0.5 to 10 parts by weight, and more preferably about 1 to 8 parts by weight (particularly about 1 to 5 parts by weight), and may be about 3 to 8 parts by weight.

Further, the curable resin-precursor may contain a curing accelerator. For example, the photo-curable resin may contain a photo-curing accelerator, e.g., a tertiary amine (such as a dialkylaminobenzoic ester) and a phosphine-series photopolymerization accelerator.

Among at least one polymer and at least one curable resin-precursor, at least two components are used in such a combination as they are phase-separated with each other in the neighborhood of a processing temperature. As such a combination, for example, there may be mentioned (a) a combination in which a plurality of polymers are incompatible with each other and form a phase separation, (b) a combination in which a polymer and a curable resin-precursor are incompatible with each other and form a phase separation, (c) a combination in which a plurality of curable resin-precursors are incompatible with each other and form a phase separation, and other combinations. Among these combinations, (a) the combination of the plurality of polymers or (b) the combination of the polymer with the curable resin-precursor is usually employed, and (a) the combination of the plurality of polymers is particularly preferred. When both components to be phase-separated have high compatibility, both components fail to generate effective phase separation during a drying step for evaporating the solvent, and thus obtained layer has a low function as an anti-glare layer.

The thermoplastic resin and the curable resin-precursor (or cured resin) are usually incompatible with each other. When the polymer and the curable resin-precursor are incompatible with each other and are phase-separated, a plurality of polymers may be used as the polymer. When a plurality of polymer are used, at least one polymer needs only to be incompatible with the resin-precursor (or cured resin), and other polymer (s) may be compatible with the resin-precursor.

Moreover, the above-mentioned combination may be a combination of two thermoplastic resins incompatible with each other with a curable compound (in particular a monomer or oligomer having a plurality of curable functional groups). Further, from the viewpoint of abrasion resistance after curing, one polymer of the above-mentioned incompatible thermoplastic resins (particularly both polymers) may be a thermoplastic resin having a functional group participating or reacting in a curing reaction (a functional group participating or reacting in curing of the curable resin-precursor).

When the polymer comprises a plurality of polymers incompatible with each other to form phase separation, the curable resin-precursor is used in combination with at least one polymer among a plurality of polymers incompatible with each other so that the precursor and the polymer can be compatible with each other in the neighborhood of a processing temperature. That is, when a plurality of polymers incompatible with each other comprise, for example, a first resin and a second resin, the curable resin-precursor needs only to be compatible with at least one of the first resin and the second resin, or may be preferably compatible with both resin components. When the curable resin-precursor is compatible with both resin components, at least two phases which are phase-separated are obtained, one phase comprises a mixture containing the first resin and the curable resin-precursor as main components, the other phase comprises a mixture containing the second resin and the curable resin-precursor as main components.

When the plurality of polymers to be selected have high compatibility with each other, the polymers fail to generate effective phase separation among themselves during a drying step for evaporating the solvent, and thus obtained layer has a low function as an anti-glare layer. The phase separability among the polymers can be judged conveniently by visually conforming whether the residual solid content becomes clouded or not during a step of preparing a uniform liquid composition with a good solvent to both components and gradually evaporating the solvent.

Further, the polymer and the cured or crosslinked resin obtained by curing the resin-precursor are usually different from each other in refraction index. Moreover, the plurality of the resins (the first resin and the second resin) are also different from each other in refraction index. The difference in refraction index between the polymer and the cured or cross linked resin and the difference in refraction index between the plurality of the resins (the first resin and the second resin) may be, for example, about 0.001 to 0.2 and preferably about 0.05 to 0.15.

The ratio (weight ratio) of the polymer relative to the curable resin-precursor is not particularly limited to a specific one and, for example, the polymer/the curable resin-precursor may be selected within the range of about 5/95 to 95/5. From the viewpoint of surface hardness, the ratio (weight ratio) is preferably about 5/95 to 60/40, more preferably about 10/90 to 50/50, and particularly about 10/90 to 40/60.

[Anti-Glare Film]

The anti-glare film of the present invention at least contains an anti-glare layer. For example, the anti-glare film may contain the anti-glare layer alone; usually the anti-glare film may further contain a transparent film, a first side of the transparent film having the anti-glare layer.

The anti-glare layer may contain a conventional additive as far as the additive does not have an adverse effect on optical characteristics of the anti-glare layer; the additive may include, for example, an organic or inorganic particle, a stabilizer (e.g., an antioxidant and an ultraviolet absorber), a surfactant, a water-soluble polymer, a filler, a crosslinking agent, a coupling agent, a coloring agent, a flame retardant, a lubricant, a wax, a preservative, a viscosity modifier, a thickener, a leveling agent, and a defoaming agent.

The anti-glare layer may have a thickness of about 0.3 to 20 μm, preferably about 1 to 15 μm (for example, about 1 to 10 μm), and is usually about 2 to 10 μm (particularly about 3 to 7 μm). When the anti-glare film comprises the anti-glare layer alone, the thickness of the anti-glare layer may for example be selected from about 1 to 100 μm (preferably about 3 to 50 μm).

(Transparent Film)

As the transparent film (transparent support or substrate sheet), there may be exemplified a resin sheet in addition to glass and ceramics. As a resin constituting the transparent film, the resin similar to that of the above-mentioned anti-glare layer may be used. The preferred transparent film includes a transparent polymer film, for example, a film formed with a cellulose derivative [e.g., a cellulose acetate such as a cellulose triacetate (TAC) or a cellulose diacetate], a polyester-series resin [e.g., a poly(ethylene terephthalate) (PET), a poly(butylene terephthalate) (PBT), and a polyarylate-series resin], a polysulfone-series resin [e.g., a polysulfone, and a polyether sulf one (PES)], a polyether ketone-series resin [e.g., a polyether ketone (PEK) and a polyether ether ketone (PEEK)], a polycarbonate-series resin (PC), apolyolefinic resin (e.g., a polyethylene and a polypropylene), a cyclic polyolefinic resin (e.g., ARTON and ZEONEX), a halogen-containing resin (e.g., a poly(vinylidene chloride)), a (meth)acrylic resin, a styrenic resin (e.g., a polystyrene), a vinyl acetate- or vinyl alcohol-series resin (e.g., a poly(vinyl alcohol)) and others.

The transparent film may be stretched monoaxially or biaxially and preferably has an optically isotropy. The preferred transparent film includes a support film having a low birefringence index. The optically isotropic transparent film may include a non-stretched film, and, for example, may include a sheet or film formed from a polyester (e.g., a PET, and a PBT), a cellulose ester, in particular a cellulose acetate (e.g., a cellulose acetate such as a cellulose diacetate or a cellulose triacetate, and an ester of a cellulose with acetic acid and a $C_{3-4}$ organic acid, such as a cellulose acetate propionate or a cellulose acetate butyrate) or the like.

The thickness of the transparent film having a two-dimensional structure may be selected within the range of, for example, about 5 to 2000 μm, preferably about 15 to 1000 μm, and more preferably about 20 to 500 μm.

(Other Optical Layers)

The anti-glare film of the present invention has not only a high anti-glareness but also a high light-scattering property. In particular, the anti-glare film makes a scattered intensity at a particular angle range larger with allowing a light to transmit and scatter isotropically. Further, the anti-glare film has a high image clarity (clearness or sharpness) of a transmitted image. Thus the anti-glare film of the present invention may be used in combination with other optical layers [for example, a variety of optical elements to be disposed into a light path, e.g., a polarizing plate, an optical retardation plate (or a phase plate), a light guide plate, an anti-reflection plate, and a low-refraction-index layer (or a low-refraction layer)] to provide an optical member. That is, the anti-glare film may be disposed or laminated on at least one light path surface of an optical element. For example, the anti-glare film may be laminated on at least one surface of the optical retardation plate, or may be disposed or laminated on an output surface (or emerge surface) of the light guide plate.

In particular, the anti-glare film containing the anti-glare layer having abrasion resistance can be also performed as a protective film. The anti-glare film of the present invention is, therefore, suitable for utilizing as a laminate (optical member) in which the anti-glare film is used instead of at least one protective film among two protective films for a polarizing plate, that is, as a laminate (optical member) in which the anti-glare film is laminated on at least one side of a polarizing plate. Use of the anti-glare film as a protective film for each side of a polarizing plate can subdue sparkling on a display surface and impart a high abrasion resistance to an optical element (e.g., a polarizing plate).

These optical layers may be used instead of the above-mentioned transparent film or may further be laminated to the transparent film.

(Adhesive Layer)

The anti-glare film of the present invention may have an adhesive layer; at least a portion (area) of a second side of the transparent film may have the adhesive layer. An anti-glare film in which the second side of the transparent film has the adhesive layer is also usable as a protective film for various touch panel displays (including a smart phone and a tablet PC).

The adhesive layer comprises a commonly used transparent adhesive. The adhesive may include, for example, a rubber-series adhesive, an acrylic adhesive, an olefinic adhesive (e.g., a modified olefinic adhesive), and a silicone-series adhesive.

As the rubber-series adhesive, for example, there may be mentioned a combination of a rubber component (such as a natural rubber, a synthetic rubber, or a thermoplastic elastomer) and a tackifier (such as a terpene resin, a rosin-series resin, a petroleum resin, or a modified olefinic resin).

As the acrylic adhesive, for example, there may be used an adhesive composed of an acrylic copolymer containing a $C_{2-10}$alkyl acrylate (e.g., ethyl acrylate, butyl acrylate, and 2-ethylhexyl acrylate) as a main component. A copolymerizable monomer for the acrylic copolymer may include, for example, a (meth)acrylic monomer [e.g., (meth)acrylic acid, methyl(meth)acrylate, hydroxyethyl(meth)acrylate, hydroxypropyl(meth)acrylate, dimethylaminoethyl(meth)acrylate, glycidyl(meth)acrylate, acrylamide, and N-methylolacrylamide], a polymerizable nitrile compound [e.g., (meth)acrylonitrile], an unsaturated dicarboxylic acid or a derivative thereof (e.g., maleic anhydride and itaconic acid), a vinyl ester (e.g., vinyl acetate and vinyl propionate), and an aromatic vinyl compound (e.g., styrene).

The olefinic adhesive may include, for example, an ethylene-(meth)acrylic acid copolymer, an ethylene-2-hydroxyethyl(meth)acrylate copolymer, an ethylene-glycidyl(meth)acrylate copolymer, an ethylene-vinyl acetate-(meth)acrylic acid copolymer, an ethylene-ethyl(meth)acrylate-maleic acid (anhydride) copolymer, and a partially saponified product of an ethylene-vinyl acetate copolymer.

As the silicone-series adhesive, for example, there may be used an adhesive containing a silicone rubber component and a silicone resin component dissolved in an organic solvent; the silicone rubber component may include, e.g., an MQ resin composed of a monofunctional $R_3SiO_{1/2}$ [wherein R represents an alkyl group (such as methyl group) or an aryl group (such as phenyl group), the same applies hereinafter] and tetrafunctional $SiO_2$, and the silicone resin component may include, for example, a bifunctional $R_2SiO$ alone, or an oily or rubbery component containing a combination of a bifunctional $R_2SiO$ and a monofunctional $R_3SiO_{1/2}$. The silicone rubber component may be crosslinked.

Among these adhesives, the silicone-series adhesive is preferred from the viewpoint of optical characteristics or reworkability.

The adhesive layer may have a thickness of, for example, about 1 to 150 preferably 10 to 100 and more preferably about 20 to 70 μm (particularly, about 25 to 50 μm).

The whole of the second side of the transparent film may have the adhesive layer, or a portion or region (e.g., the periphery (or edge)) of the second side thereof may have the adhesive layer. In order to improve the easiness in handling, the anti-glare film may be provided with a frame member on the periphery thereof (for example, a plastic sheet may be laminated on the periphery thereof), and the adhesive layer may be attached on the frame member.

(Characteristics of Anti-Glare Film)

The anti-glare film of the present invention has a finely (or minutely) uneven structure, corresponding to a phase-separation structure, formed in large quantities (numbers) on the surface of the anti-glare layer. Thus the anti-glare film can prevent reflection of a surrounding scenery caused by surface reflection and improves anti-glareness. Moreover, the anti-glareness can be evaluated by visual observation of a fluorescent tube reflection and by a gloss meter according to JIS K7105. The anti-glare film (anti-glare layer) of the present invention may have a 60° gloss of not less than 30, and may for example be about 30 to 80, preferably about 40 to 70, and more preferably about 50 to 60 (particularly, about 52 to 55). An anti-glare film (anti-glare layer) having an excessively small gloss is liable to cause sparkling or blur of characters.

Further, sparkling and blur of characters can be evaluated by means of a high definition liquid crystal display (or display apparatus) having a resolution of about 200 ppi, and more simply, can be evaluated visually by means of a high definition smart phone having a resolution of about 300 ppi. The anti-glare film of the present invention disposed on a display having a resolution of 200 ppi allows subdued sparkling even in a case where the anti-glare layer is not less than 0.05 mm (particularly, about 0.1 to 0.4 mm) away from a visual surface of the display.

Furthermore, for securing anti-glareness, and reducing sparkling and avoiding blur of characters at an optimal level for the anti-glare film of the present invention, it is preferable that a transmitted image clarity, a haze, a total light transmittance be adjusted within specified ranges as optical characteristics.

The anti-glare film may have a transmitted image clarity selected from the range of about 70 to 100% and may be preferably about 75 to 100% (e.g., about 75 to 95%) and more preferably about 80 to 100% (particularly, about 80 to 90%) when an optical slit of 0.5 mm is used. An excessively small transmitted image clarity increases blur of a transmitted light; since use of an anti-glare film having such a small transmitted image clarity for a high definition display causes vagueness or unclearness of the pixel border, the blur of characters is liable to occur.

The transmitted image clarity is a measure for quantifying defocusing or distortion of a light transmitted through a film. The transmitted image clarity is obtained by measuring a transmitted light from a film through a movable optical slit, and calculating amount of light in both a light part and a dark part of the optical slit. That is, when a transmitted light is defocused by a film, the slit image formed on the optical slit becomes thicker, and as a result the amount of light in the transmitting part is not more than 100%. On the other hand, in the non-transmitting part, the amount of light is not less than 0% due to leakage of light. The value C of the transmitted image clarity is defined by the following formula according to the maximum value M of the transmitted light in the transparent part of the optical slit, and the minimum value m of the transmitted light in the opaque part thereof.

$$C(\%)=[(M-m)/(M+m)]\times 100$$

That is, the closer the value C comes to 100%, the lower the image defocusing depending on the anti-glare film becomes [Reference; Suga and Mitamura, Tosou Gijutsu, July, 1985].

As an apparatus for measuring the transmitted image clarity, there may be used an image clarity measuring apparatus ICM-1DP (manufactured by Suga Test Instruments Co., Ltd.). As the optical slit, there may be used an optical slit of 0.125 mm to 2 mm width.

The anti-glare film of the present invention has a haze of, for example, about 10 to 40%, preferably about 12 to 35%, and more preferably about 15 to 30% (particularly, about 20 to 30%). In a case where the anti-glare film has an excessively high haze, sparkling and blur of characters are liable to occur; in a case where the anti-glare film has an excessively low haze, anti-glareness is decreased.

The anti-glareness film of the present invention has a total light transmittance of, for example, about 70 to 100%, preferably about 80 to 100%, more preferably about 85 to 100% (e.g., about 85 to 95%), and particularly about 90 to 100% (e.g., about 90 to 990).

The haze and the total light transmittance can be measured using a NDH-5000W haze meter (manufactured by Nippon Denshoku Industries Co., Ltd.) in accordance with JIS K7105.

The anti-glareness film (anti-glare layer) of the present invention may have a pencil hardness (750 g load) of, for example, not less than H (particularly, not less than 2H), e.g., about H to 4H and preferably about 2H to 3H, in accordance with JIS K5400.

(Process for Producing Anti-Glare Film)

The anti-glare film of the present invention is obtainable by applying a liquid composition containing a plurality of resin components on a support (in particular, a transparent film) and drying the composition to form a phase-separation structure by spinodal decomposition with evaporation of a solvent. In a case where the plurality of the resin components contain a curable resin-precursor, the anti-glare film of the present invention is obtainable through a further step of curing the curable resin-precursor.

Specifically, in the drying step, a resin composition (particularly, a liquid composition or mixture, such as a uniform solution) containing the plurality of resin components (particularly, a polymer and a curable resin-precursor) and a solvent is used; during a step of evaporating or removing the solvent from a liquid phase in the resin composition (or a uniform solution or a coat layer thereof) with drying or other means, a phase separation by spinodal decomposition can be generated depending on condensation of the liquid phase, and the phase-separation structure in which the distance between phases (the pitch or the diameter of each net-like pattern) is relatively regular can be formed. The bicontinuous phase structure can be formed by determining a drying condition or a formulation so that the resin composition after the evaporation of the solvent can have a high melting flowability.

More specifically, the above-mentioned wet spinodal decomposition can usually be carried out by coating a support with a liquid mixture or resin composition (uniform solution) containing at least one polymer, at least one curable resin-precursor and a solvent, and evaporating the solvent from the resulting coat layer. When a separable (or releasable) support is used as the support, an anti-glare film comprising the anti-glare layer alone can be obtained by separating the anti-glare layer from the support. When a non-separable (or non-releasable) support (preferably a transparent support) is used as the support, an anti-glare film having a lamination structure composed of the support and the anti-glare layer can be obtained. Further, a bicontinuous phase structure having joined (or united) phases (dispersed phases) can be produced by increasing the evaporation temperature of the solvent or by using a low-viscous component as at least one of the resin components. The reason why the uneven structure is the bicontinuous phase structure is probably that the resin component does not lose fluidity even after the evaporation of the solvent and recesses and/or projections in the uneven structure are melted by heat and joined (or united) together.

According to the present invention, in the spinodal decomposition, with the progress of the phase separation, the bicontinuous phase structure is formed. On further proceeding and growing the phase separation, the continuous phase becomes discontinuous owing to its own surface tension to change into the droplet phase structure (e.g., an islands-in-the-sea structure containing independent phases such as ball-like shape, spherical shape, discotic shape or oval-sphere shape). Therefore, an intermediate structure of the bicontinuous phase structure and the drop phase structure (i.e., a phase structure in a transitional state from the bicontinuous phase to the droplet phase) can also be formed by varying the degree of phase separation. According to the present invention, the phase-separation structure in the anti-glare layer may be, in the initial stage of the drying process, an islands-in-the-sea structure (a droplet phase structure, or a phase structure in which one phase is independent or isolated) or a bicontinuous phase structure (or a net-like structure), or may be an intermediate structure being a coexistent state of a bicontinuous phase structure and a droplet phase structure. The phase-separation structure allows a finely uneven structure to be formed on the surface of thus obtained anti-glare layer after drying of the solvent. Further, in the drying process, the fine (or minute) recesses and projections on the surface are melted and jointed by setting a high drying temperature so that the resin composition can have fluidity even after the drying of the solvent and/or by using a low-viscous component as at least one of the resin components; the original bicontinuous structure can be changed into an uneven structure having an increased continuity.

The solvent to be used in wet spinodal decomposition may be selected depending on the species and solubility of the polymer and the curable resin-precursor, and needs only to be a solvent for uniformly dissolving at least solid content (a plurality of polymers and curable resin-precursor(s), a reaction initiator, other additive(s)). As such a solvent, there may be mentioned, for example, a ketone (e.g., acetone, methyl ethyl ketone, methyl isobutyl ketone, and cyclohexanone), an ether (e.g., dioxane and tetrahydrofuran), an aliphatic hydrocarbon (e.g., hexane), an alicyclic hydrocarbon (e.g., cyclohexane), an aromatic hydrocarbon (e.g., toluene and xylene), a halogenated hydrocarbon (e.g., dichloromethane and dichloroethane), an ester (e.g., methyl acetate, ethyl acetate, and butyl acetate), water, an alcohol (e.g., ethanol, isopropanol, butanol, and cyclohexanol), a cellosolve (e.g., methyl cellosolve and ethyl cellosolve), a cellosolve acetate, a sulfoxide (e.g., dimethyl sulfoxide), and an amide (e.g., dimethylformamide and dimethyhlacetamide). Moreover, the solvent may be a mixed solvent.

In a preferred embodiment of the resin composition (liquid mixture), there may be used a composition containing the thermoplastic resin, the photo-curable compound, the photopolymerization initiator, and the solvent for dissolving the thermoplastic resin and the photo-curable compound. In another preferred embodiment, there may be used a composition containing the plurality of polymers incompatible with each other, the photo-curable compound, the photopolymerization initiator, and the solvent.

The concentration of the solute (the polymer, the curable resin-precursor, the reaction initiator, and other additive(s)) in the liquid mixture can be selected within the range causing the phase separation and not deteriorating castability and coatability, and is, for example, about 1 to 80% by weight, preferably about 5 to 60% by weight, and more preferably about 15 to 40% by weight (particularly about 20 to 40% by weight).

The casting or coating method may include a conventional manner, for example, a spray, a roll coater, an air knife coater, a blade coater, a rod coater, a reverse coater, a bar coater, a comma coater, a dip and squeeze coater, a die coater, a gravure coater, a microgravure coater, a silkscreen coater, a dipping method, a spraying method, and a spinner method. Among these methods, a bar coater or a gravure coater is used widely.

After the liquid mixture is cast or applied, the phase separation by spinodal decomposition can be induced by evaporating (or removing) the solvent. The evaporation (or removal) of the solvent is preferably carried out by heat-drying the mixture in terms of easy formation (production) of the ridge on the surface of the anti-glare layer. The drying temperature may be selected from the range of, for example, about 30 to 200° C., (e.g., about 40 to 150° C.). In order to form the bicontinuous phase structure easily, the drying temperature may be a temperature higher than 80° C., for example, about 82 to 120° C., preferably about 85 to 110° C., and more preferably about 88 to 105° C. (particularly, about 90 to 100° C.). The drying time is, for example, about 1 to 60 minutes, preferably about 1.2 to 50 minutes, and more preferably about 1.5 to 30 minutes (particularly, about 1.8 to 10 minutes). In a case where the drying temperature is too low or the drying time is too short, the heat quantity imparted to the resin component is insufficient, and thus the melting flowability of the resin component is excessively decreased, which makes the formation of the ridge difficult. In contrast, in a case where the drying temperature is too high or the drying time is too long, the height of the once formed ridge is reduced due to further flowing while the structure of the ridge is maintained. Thus the drying temperature and the drying time can be used as a means for adjusting the height of the ridge to control anti-glareness or slipperiness.

According to the present invention, the drying of the coat layer at such a relatively high temperature for an appropriate time can impart a heat quantity enough to melt and fluidize the resin component. Thus the spinodal decomposition accompanied by evaporation of the solvent allows easy formation of the ridge and the bicontinuous phase structure as well as regularity and periodicity of the average distance between domains of the phase-separation structure.

In the curing step, the phase-separation structure formed by spinodal decomposition can immediately be fixed by curing the precursor. The curing of the precursor can be carried out with applying heat, light irradiation, or a combination of these methods depending on the species of curable resin-precursor. The heating temperature may be selected within the appropriate range (e.g., about 50 to 150° C.) as far as the phase-separation structure can be obtained, or may be selected within the temperature range similar to that in the above-mentioned phase separation process.

Light irradiation can be selected depending on the species of the photo-curable component or the like, and ultraviolet ray, electron beam or the like is usually available for light irradiation. The general-purpose light source for exposure is usually an ultraviolet irradiation equipment. If necessary, light irradiation may be carried out under an inert (or inactive) gas atmosphere.

For example, the light source to be used for the ultraviolet ray may include a Deep UV lamp, a low-pressure mercury lamp, a high-pressure mercury lamp, a superhigh-pressure mercury lamp, a halogen lamp, and a laser light source (a light source such as a helium-cadmium laser or an excimer laser). The quantity of the irradiated light (irradiation energy) varies depending on the thickness of the coated layer. The quantity of the irradiated light may for example be about 50 to 10000 mJ/cm$^2$, preferably about 70 to 7000 mJ/cm$^2$, and more preferably about 100 to 5000 mJ/cm$^2$.

In a case where the adhesive layer is formed, the adhesive layer may be formed by applying a liquid composition for the adhesive layer on the second side of the transparent film with a conventional method, for example, the above-mentioned casting or coating (or applying) method.

[Display (Display Apparatus)]

The anti-glare film of the present invention has a hardcoat property and a high anti-glareness. Moreover, the anti-glare film can improve a scattered light intensity in a specific angle range while transmitting and scattering a light isotropically. Further, the anti-glare film has an excellent clearness (or sharpness) of a transmitted image and reduces blur of characters in a display surface (or visual surface). Thus the anti-glare film of the present invention can be used for various displays (or display apparatuses), for example, a display (or a display apparatus) such as a liquid crystal display (LCD), an organic EL display (OLED), a plasma display, or a display provided with a touch panel. In particular, the anti-glare film of the present invention is usable as a member that does not cause lowering of the image quality due to sparkling or blur of characters even in a case where the anti-glare film is disposed on a high definition display having a resolution of not less than 200 ppi (particularly, not less than 300 ppi). Thus the anti-glare film of the present invention is preferably usable for an apparatus often used as a high definition display among these displays, for example, a liquid crystal display (including a liquid crystal display provided with a touch panel) and an organic EL display (including an organic EL display provided with a touch panel).

The liquid crystal display may be a reflection-mode liquid crystal display using an external light (or outside light) for illuminating a display unit comprising a liquid crystal cell, or may be a transmission-mode (or transmissive) liquid crystal display comprising a backlight unit for illuminating a display unit. In the reflection-mode liquid crystal display, the display unit can be illuminated by taking in an incident light from the outside through the display unit, and reflecting the transmitted incident light by a reflective member. In the reflection-mode liquid crystal display, the anti-glare film or optical member (particularly a laminate of a polarizing plate and the anti-glare film) can be disposed in a light path in front of the reflective member. For example, the anti-glare film of the present invention may be disposed or laminated, for example, between the reflective member and the display unit, or in front of the display unit.

In the transmission-mode liquid crystal display, the backlight unit may comprise a light guide plate (e.g., a light guide plate having a wedge-shaped cross section) for allowing a light from a light source (e.g., a tubular light source such as a cold cathode tube, a point light source such as a light emitting diode) incident from one side of the light guide plate and for allowing the incident light to emit from the front output (or emerge) surface. Moreover, if necessary, a prism sheet may be disposed in front of the light guide plate. Incidentally, a reflective member for allowing alight obtained from the light source to reflect to the output surface side is usually disposed on the reverse side of the light guide plate. In such a transmission-mode liquid crystal display, the anti-glare film or the optical member may usually be disposed or laminated into a light path in front of the light source. For example, the anti-glare film or optical member can be disposed or laminated between the light guide plate and the display unit, in front of the display unit, or others.

The anti-glare film of the present invention is particularly favorable for an organic EL display. In the organic EL, a light-emitting layer comprises a light-emitting diode (LED)

composed of an organic compound; light is emitted by excitons generated by recombination of electrons and holes injected in the organic compound. A luminescent material to be used in the light-emitting layer may be a high molecular weight material or a low molecular weight material. Moreover, the organic EL comprises a light-emitting element at each pixel; the light-emitting element is usually formed by a negative electrode/an electron-injecting layer/an electron-transporting layer/a light-emitting layer/a hole-transporting layer/a hole-injecting layer/a positive electrode/a basal plate (such as a glass plate or a transparent plastic plate).

Further, the organic EL has a hetero structure; electrons and holes are trapped in separate layers. The hetero structure may be a double hetero structure.

With respect to the electrodes, usually a metal oxide (such as an ITO) is employed as an anode, and a metal (such as Al, Mg, Ag, or a Li alloy) is employed as a cathode. As a material for each layer, an organic matter (e.g., a diamine, anthracene, and a metal complex) is usually employed. In more detail, the hole-transporting layer may be comprise oxadiazole•triazole or others. A hole-blocking layer may comprise a phenanthrene derivative or others. A dopant material may be DCM2 [4-(dicyanomethylene)-2-methyl-6-(p-dimethylaminostyryl)-4H-pyran], coumarin 6, perylene, or others. Each of the layers between these electrodes may have a thickness of several (a few) nm to several (a few) hundred nm as far as the layers have a thickness of about not more than 1 µm in total.

The drive system may be an active matrix driving system or a passive matrix driving system; in the active matrix driving system, the organic EL is driven by disposing an active device such as a TFT (thin film transistor) at each pixel, and in the passive matrix driving system, a current is applied to orthogonal stripe-shaped electrodes in exact timing to sequentially drive each pixel in the intersections of the electrodes.

The reason why the anti-glare film of the present invention is favorable for an organic EL is probably that (i) the organic EL has a high luminescence intensity of pixel, and further (ii) the pixel itself emits light and thus the light does not pass through a color filter, differently from a liquid crystal display. That is, since the organic EL light has no directional orientation and is liable to cause sparkling, it is estimated that a conventional anti-glare film prevents sparkling of the organic EL while reduces anti-glareness.

Moreover, the anti-glare film of the present invention is favorable for a liquid crystal display or organic EL display (in particular, an organic EL display) having PenTile matrix (in which a first pixel consisting of green and red (GR) subpixels and a second pixel consisting of green and blue (GB) subpixels are arrayed alternately), because sparkling can be subdued.

Further, the anti-glare film of the present invention can prevent sparkling even in a case where there is a distance between the anti-glare layer and a display surface; the anti-glare film is also preferably usable as an aftermarket film for protecting a display surface from abrasion or scratches (particularly, a protective film for organic EL display). In particular, since the anti-glare film of the present invention can subdue sparkling even in a case where the anti-glare layer is disposed apart from a display surface, the anti-glare film is useful as a protective film used at a distance (a distance between the display surface and the anti-glare layer) of not less than 0.05 mm (particularly, about 0.1 to 0.4 mm) from the display surface (a film that is disposed on an outermost surface and greatly away from the display surface due to an adhesive layer between the anti-glare film and the display surface).

According to the present invention, since the anti-glare film contains an anti-glare layer densely having a ridge on a surface thereof, wherein the ridge is formed by phase separation of a plurality of resin components and has a branched structure and a total length of not less than 100 µm, the anti-glare film achieves well-balanced haze and image clarity, has improved anti-glareness, highly subdued sparkling and prevented blur of characters when disposed on a high definition display (for example, a liquid crystal display having a resolution of not less than 200 ppi, and an organic EL display). Further, the anti-glare film achieves both anti-glareness and sparkling resistance when disposed apart from a display surface of a high definition display (such as an organic EL panel), and has improved abrasion resistance (or scratch resistance). Thus even use of the anti-glare film as a protective film for a high definition display (such as an organic EL panel) allows both characteristics described above.

The anti-glare film of the present invention is usable as an anti-glare film for a variety of displays (apparatuses or devices), for example, a liquid crystal display (LCD), a cathode ray tube display, an organic or inorganic electroluminescence (EL) display, a field emission display (FED), a surface-conduction electron-emitter display (SED), a rear projection television display, a plasma display, a touch panel-equipped display.

Among them, the anti-glare film of the present invention is useful for various displays, including a PC monitor and a television. Since the anti-glare film achieves anti-glareness, sparkling resistance and prevention of blurred characters for a high definition display, the anti-glare film is particularly useful as an anti-glare film for a display for car navigation systems, a display for a smart phone or a tablet personal computer (PC), and a display (display apparatus) equipped with a touch panel.

In particular, the film in which the anti-glare layer contains a curable resin-precursor has an excellent abrasion resistance and can maintain the above-mentioned optical characteristics even when disposed apart from a display surface of an extremely high definition display (e.g., having a resolution of not less than 300 ppi) and thus the film is particularly useful as an aftermarket protective film for a liquid crystal display or an organic EL display (in particular, an organic EL display).

EXAMPLES

The following examples are intended to describe this invention in further detail and should by no means be interpreted as defining the scope of the invention. Anti-glare films obtained in Examples and Comparative Examples were evaluated by the following items.

[Ridge Size and Area]

Based on a laser reflection microscope photograph of a surface of a film, the presence of a ridge per square millimeter was observed, and the average diameter of each net-like pattern in a bicoutinuous phase structure was obtained from the averaged value of measurements at any 10 points. Further, in an area of 1 mm², the length ratio of the ridge having a branched structure relative to a projection other than the ridge was measured.

The area of the protruded portion was measured by anon-contact surface/layer cross-section form measurement system ["VertScan" manufactured by Ryoka Systems Inc.].

According to this system, the form of the surface of the anti-glare layer can be measured three-dimensionally using the interference of light, and the area of the protruded portion can be determined by means of image processing.

[Viscosity]

The viscosity was measured at 25° C. using a B-type viscositymeter ("BL type" manufactured by Tokyo Keiki Inc.) in accordance with JIS 28803.

[Haze and Total Light Transmittance]

The haze and the total light transmittance were measured using a haze meter (manufactured by Nippon Denshoku Industries Co., Ltd., the trade name "NDH-5000W") in accordance with JIS K7136.

[Transmitted Image (Image) Clarity]

The image clarity of the anti-glare film was measured in accordance with JIS K7105 by using an image clarity measuring apparatus (manufactured by Suga Test Instruments Co., Ltd., trade name "ICM-1T"). The image clarity was measured in the following method: the film was installed so that the machine direction of the film would be parallel to the teeth direction of an optical slit. The image clarity was measured by using the image clarity measuring apparatus provided with an optical slit (the slit width=0.5 mm).

[60° Gloss]

The 60° gloss was measured using a gloss meter ("IG-320" manufactured by Horiba, Ltd.) in accordance with JIS K7105.

[Pencil Hardness]

The pencil hardness was measured by applying a load of 750 g in accordance with JIS K5400.

[Anti-Flareness]

The anti-glareness was determined by projecting a bare fluorescent tube (louver-free fluorescent tube) on the anti-glare film, and visually evaluating glareness of the regular-reflected light on the basis of the following criteria.

"A": Glareness is unrecognized.
"B": Glareness is slightly recognized.
"C": Glareness is recognized.

[Sparkling]

The resulting anti-glare film was disposed on a smart phone having an organic EL display with a resolution of 315 ppi ("Galaxy NEXUS" manufactured by Samsung Electronics Co., Ltd.), and the sparkling (glare) on the display surface was visually evaluated on the basis of the following criteria.

"A": No sparkling is recognized.
"B": Sparkling is slightly recognized.
"C": Sparkling is recognized.

[Blur of Characters]

The resulting anti-glare film was disposed on a smart phone having an organic EL display with a resolution of 315 ppi ("Galaxy NEXUS" manufactured by Samsung Electronics Co., Ltd.), and the blur of characters in the display surface was visually evaluated on the basis of the following criteria.

"A": No blur of characters is recognized.
"B": Blur of characters is slightly recognized.
"C": Blur of characters is recognized.

Example 1

In a mixed solvent containing 25 parts by weight of methyl ethyl ketone (MEK) and 12.15 parts by weight of 1-butanol were dissolved 5.65 parts by weight of an acrylic resin having a polymerizable unsaturated group (s) in a side chain thereof [a compound in which 3,4-epoxycyclohexenylmethyl acrylate is added to one or some carboxyl group(s) in a (meth)acrylic acid-(meth)acrylate copolymer; manufactured by Daicel Corporation, "CYCLOMER P(ACA)320M", solid content: 49.6% by weight], 1.2 parts by weight of a cellulose acetate propionate (acetylation degree=2.5%, propionylation degree=46%, number-average molecular weight in terms of polystyrene: 75000; manufactured by Eastman, Ltd., "CAP-482-20"), 4 parts by weight of a polyfunctional acrylic UV-curable compound (manufactured by DAICEL-ALLNEX Ltd., "DPHA", viscosity: 5250 mPa·s), 2.77 parts by weight of an acrylic UV-curable compound (manufactured by DAICEL-ALLNEX Ltd., "PETIA", viscosity: 1100 mPa·s), and 0.53 parts by weight of a photo initiator (manufactured by BASF, "IRGACURE 907"). This solution was cast on a PET film having a thickness of 100 μm (manufactured by Toyobo Co., Ltd., "A4300") with the use of a wire bar #24, and then allowed to stand for 2 minutes in an oven at 95° C. for evaporation of the solvent to form a coat layer having a thickness of about 7 μm. Then, the coat layer was subjected to UV curing treatment for about 10 seconds by irradiation of ultraviolet ray derived from a high-pressure mercury lamp (manufactured by Eyegraphics Co., Ltd.).

Figure 2:
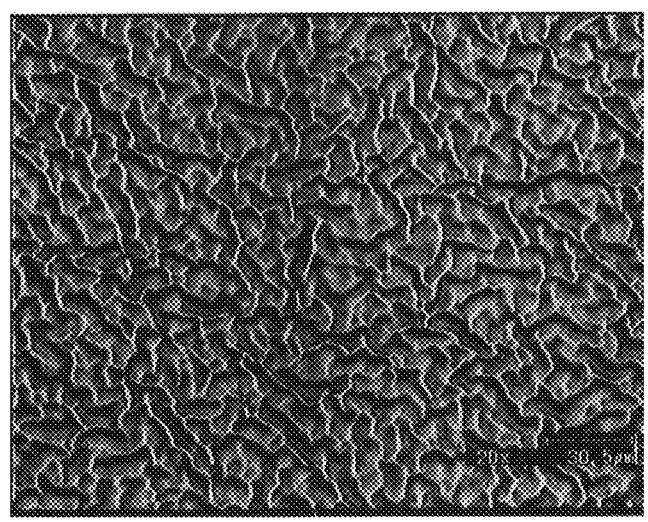
FIG. 2 represents a laser reflection microscope photograph of a surface of an anti-glare layer of an anti-glare film obtained in Example 1.

The observation of the coat layer by a laser reflection microscope revealed that the whole surface of the coat layerhadabicontinuous phase-separation structure as shown in FIG. 2. More specifically, the surface of the coat layer had one continuous net-like ridge per square millimeter; the ratio of the ridge having a branched structure among all protruded portions was substantially 100%. In this surface structure, the average diameter of each net-like pattern in the bicontinuous phase structure was about 5 μm, and a major part (about 98%) of the whole surface had the protruded portion.

Moreover, the resulting sheet was attached on a smart phone with a high definition organic EL display, and sparkling on a screen image was not recognized. Further, the sheet had no reflection of interior fluorescent tube and had an excellent anti-glareness, and no blur of characters was recognized.

Example 2

In a mixed solvent containing 25 parts by weight of MEK and 12.15 parts by weight of 1-butanol were dissolved 5.65 parts by weight of an acrylic resin having a polymerizable unsaturated group (s) in a side chain thereof [CYCLOMER P(ACA)320M], 1.2 parts by weight of a cellulose acetate propionate (CAP-482-20), 6 parts by weight of a polyfunctional acrylic UV-curable compound (DPHA), 0.77 parts by weight of a silicone-containing acrylic UV-curable compound (manufactured by DAICEL-ALLNEX Ltd., "EB1360", viscosity: 2100 mPa·s), and 0.53 parts by weight of a photo initiator (IRGACURE 907). This solution was cast on a PET film having a thickness of 100 μm (A4300) with the use of a wire bar #24, and then allowed to stand for 2 minutes in an oven at 90° C. for evaporation of the solvent to form a coat layer having a thickness of about 7 μm. Then, the coat layer was subjected to UV curing treatment for about 10 seconds by irradiation of ultraviolet ray derived from a high-pressure mercury lamp (manufactured by Eyegraphics Co., Ltd.).

Figure 3:
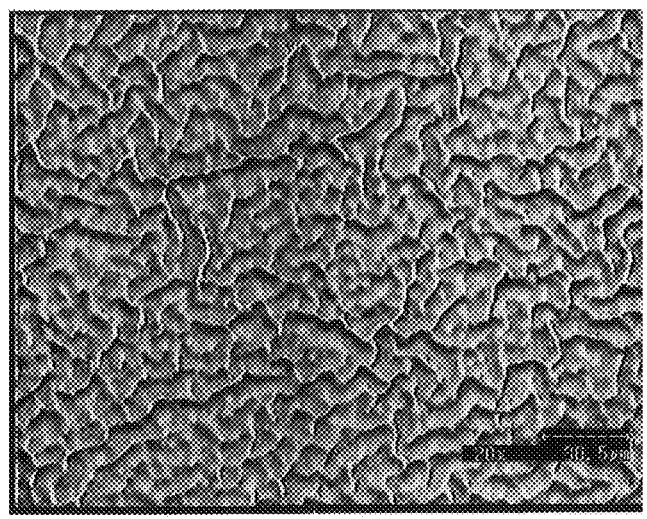
FIG. 3 represents a laser reflection microscope photograph of a surface of an anti-glare layer of an anti-glare film obtained in Example 2.

The observation of the coat layer by a laser reflection microscope revealed that the surface of the coat layer partly had a bicontinuous phase-separation structure having a droplet phase-separation structure (droplet phase structure) as shown in FIG. 3. More specifically, the surface of the coat layer had one continuous net-like ridge per square millimeter; the length ratio of the ridge having a branched structure relative to a projection other than the ridge was about 80/20 in a ratio of the former/the latter. In this surface structure, the average diameter of each net-like pattern in the bicontinuous phase structure was about 4 μm, and a major part (about 89%) of the whole surface had the protruded portion.

Moreover, the resulting sheet was attached on a smart phone with a high definition organic EL display, and sparkling on a screen image was not recognized. Further, the sheet had no reflection of interior fluorescent tube and had an excellent anti-glareness.

Comparative Example 1

An UV-cured coat layer was produced in the same manner as in Example 1 except that the drying temperature was 70° C. The observation of the coat layer by a transmission optical microscope revealed that the coat layer had a droplet phase-separation structure.

Moreover, the resulting sheet was attached on a smart phone with a high definition organic EL display, and the sheet had no reflection of interior fluorescent tube, had an excellent anti-glareness, and showed no blur of characters; however, sparkling on a screen image was recognized.

Comparative Example 2

In a mixed solvent containing 25 parts by weight of MEK and 12.15 parts by weight of 1-butanol were dissolved 5.65 parts by weight of an acrylic resin having a polymerizable unsaturated group(s) in a side chain thereof [CYCLOMER P(ACA) 320M], 1.2 parts by weight of a cellulose acetate propionate (CAP-482-20), 6.77 parts by weight of a polyfunctional acrylic UV-curable compound (DPHA), and 0.53 parts by weight of a photo initiator (IRGACURE 907). This solution was cast on a PET film having a thickness of 100 μm (A4300) with the use of a wire bar #24, and then allowed to stand for 2 minutes in an oven at 90° C. for evaporation of the solvent to form a coat layer having a thickness of about 7 μm. Then, the coat layer was subjected to UV curing treatment for about 10 seconds by irradiation of ultraviolet ray derived from a high-pressure mercury lamp (manufactured by Eyegraphics Co., Ltd.).

The observation of the coat layer by a laser reflection microscope revealed that the coat layer had a droplet phase-separation structure as shown in FIG. 1.

Moreover, the resulting sheet was attached on a smart phone with a high definition organic EL display, and the sheet had no reflection of interior fluorescent tube and had an excellent anti-glareness, and sparkling on a screen image was not recognized; however, blur of characters was significantly recognized.

Table 1 shows the evaluation of the anti-glare films obtained in Examples and Comparative Examples.

TABLE 1

|  | Examples | | Comparative Examples | |
| --- | --- | --- | --- | --- |
|  | 1 | 2 | 1 | 2 |
| Structure | Bicontinuous | Bicontinuous | Droplet | Droplet |
| Total light transmittance (%) | 91 | 91 | 91 | 89 |
| Haze (%) | 18 | 28 | 21 | 42 |
| Transmitted image clarity (%) | 75 | 85 | 63 | 80 |
| 60° gloss | 51 | 54 | 48 | 41 |
| Pencil hardness | 2H | 2H | 2H | 2H |
| Anti-glareness | A | B | A | A |
| Sparkling | B | A | C | A |
| Blur of characters | A | A | A | C |

As apparent from the results of Table 1, the anti-glare films of Examples had an excellent anti-glareness and subdued sparkling and blur of characters, while the anti-glare films of Comparative Examples showed sparkling or blur of characters.

What is claimed is:

1. An anti-glare film comprising an anti-glare layer having a ridge on a surface thereof, the ridge being formed by phase separation of a plurality of resin components,
    wherein an area of the ridge is 80 to 99% of the whole surface of the anti-glare layer,
    the ridge forms a bicontinuous phase structure,
    the anti-glare film has a transmitted image clarity of 70 to 100% measured with an image clarity measuring apparatus provided with an optical slit of 0.5 mm width.

2. An anti-glare film according to claim 1, wherein the bicontinuous phase structure has a net-like pattern with an average diameter of a major axis and a minor axis of each net-like pattern of 1 to 70 μm.

3. An anti-glare film according to claim 1, which has a haze of 10 to 40%, and a total light transmittance of 70 to 100%.

4. An anti-glare film according to claim 1, wherein the plurality of resin components contain:
    a plurality of polymers selected from the group consisting of a styrenic resin, a (meth)acrylic resin, an alicyclic olefinic resin, a polyester-series resin, an aliphatic organic acid cellulose ester, and an aromatic organic acid cellulose ester, and
    a cured product of at least one curable resin-precursor selected from the group consisting of an epoxy (meth)acrylate, a urethane (meth)acrylate, a polyester (meth)acrylate, a silicone (meth)acrylate, and a polyfunctional monomer having at least two polymerizable unsaturated bonds,
    wherein at least two components among the polymers are phase-separated by spinodal decomposition from a liquid phase.

5. An anti-glare film according to claim 4, wherein the curable resin-precursor contains a low-viscous curable resin-precursor having a viscosity at 25° C. of not higher than 3000 mPa·s.

6. An anti-glare film according to claim 1, which further comprises a transparent film, a first side of the transparent film having the anti-glare layer.

7. An anti-glare film according to claim 6, wherein at least portion of a second side of the transparent film has an adhesive layer.

8. An anti-glare film according to claim 1, which is a protective film to be disposed on an outermost surface of a display.

9. An anti-glare film according to claim 8, wherein the display is an organic EL display.

10. A process for producing an anti-glare film recited in claim 1, which comprises the steps of:
   applying a liquid composition containing a plurality of resin components and a solvent on a support, and
   drying the applied liquid composition to form a phase-separation structure by spinodal decomposition with evaporation of the solvent.

11. A process according to claim 10, wherein the drying step is carried out at a temperature higher than 80° C.

* * * * *